(12) United States Patent
Hu et al.

(10) Patent No.: US 10,750,286 B2
(45) Date of Patent: Aug. 18, 2020

(54) SPEAKER

(71) Applicant: AAC Technologies Pte. Ltd., Singapore (SG)

(72) Inventors: Hongjian Hu, Shenzhen (CN); Min Su, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/533,786

(22) Filed: Aug. 7, 2019

(65) Prior Publication Data
US 2020/0053469 A1 Feb. 13, 2020

(30) Foreign Application Priority Data

Aug. 13, 2018 (CN) .................... 2018 2 1301960 U

(51) Int. Cl.
| | | |
|---|---|---|
| *H04R 1/02* | (2006.01) | |
| *H04R 7/00* | (2006.01) | |
| *H04R 9/00* | (2006.01) | |
| *H04R 7/20* | (2006.01) | |
| *H01F 7/08* | (2006.01) | |
| *H01F 7/126* | (2006.01) | |
| *H05K 1/02* | (2006.01) | |
| *H05K 1/18* | (2006.01) | |
| *H04R 9/02* | (2006.01) | |
| *H04R 3/00* | (2006.01) | |
| *H04R 9/04* | (2006.01) | |
| *H04R 9/06* | (2006.01) | |

(52) U.S. Cl.
CPC .............. *H04R 7/20* (2013.01); *H01F 7/081* (2013.01); *H01F 7/126* (2013.01); *H04R 3/00* (2013.01); *H04R 9/025* (2013.01); *H04R 9/045* (2013.01); *H04R 9/06* (2013.01); *H05K 1/0277* (2013.01); *H05K 1/181* (2013.01); *H04R 2400/11* (2013.01); *H05K 2201/10083* (2013.01)

(58) Field of Classification Search
CPC ... H04R 1/00; H04R 1/02; H04R 1/06; H04R 1/021; H04R 1/2803; H04R 7/00; H04R 7/02; H04R 7/04; H04R 7/12; H04R 7/16; H04R 7/18; H04R 7/20; H04R 9/00; H04R 9/06; H04R 9/025; H04R 9/045; H04R 9/046; H04R 3/00; H04R 2400/11; H01F 7/126; H01F 7/1081; H05K 2201/10083
See application file for complete search history.

(56) References Cited

U.S. PATENT DOCUMENTS

| | | | | |
|---|---|---|---|---|
| 10,250,993 | B1 * | 4/2019 | Xiao | ............... H04R 9/06 |
| 2014/0056465 | A1 * | 2/2014 | Li | ............... H04R 9/025 |
| | | | | 381/400 |
| 2018/0288551 | A1 * | 10/2018 | Dong | ............. B29C 65/54 |
| 2018/0302724 | A1 * | 10/2018 | Li | ............... H04R 9/043 |
| 2018/0367919 | A1 * | 12/2018 | Xiao | ............... H04R 9/06 |
| 2019/0230441 | A1 * | 7/2019 | Xiao | ............... H04R 9/025 |
| 2019/0239899 | A1 * | 8/2019 | Voor | ............... A61B 17/56 |

* cited by examiner

*Primary Examiner* — Thang V Tran

(74) *Attorney, Agent, or Firm* — W&G Law Group LLP

(57) ABSTRACT

A speaker includes a frame, and a vibration system and a magnetic circuit system that are fixed on the frame. The vibration system includes a first vibration diaphragm fixed to the frame, a voice coil disposed on a side of the first vibration diaphragm and configured to drive the first vibration diaphragm to vibrate to produce sound, and an elastic support part for the elastic support coil. The elastic support part includes a flexible printed circuit board connecting the voice coil to an external circuit.

5 Claims, 3 Drawing Sheets

SPEAKER

FIELD OF THE DISCLOSURE

The present disclosure relates to -electro-acoustic conversions, and more particularly to a speaker for use in a portable electronic product.

DESCRIPTION OF RELATED ART

With the rapid social development, popularity of audio device is getting higher and higher. Among mass of recreational and entertainment methods, high-quality music is gradually popularized. Therefore, speakers for playing audios are widely used in today's smart mobile devices.

A speaker in the related art includes a frame, a vibration system and a magnetic circuit system fixed to the frame. The vibration system includes a first diaphragm fixed to the frame, a voice coil positioned on one side of the first diaphragm and configured to drive the diaphragm to vibrate to produce sound, and an elastic support part positioned on a side of the voice coil distal from the first diaphragm and configured to elastically support the voice coil. The elastic support part includes a flexible printed circuit board, the flexible printed circuit board includes an inner ring connected to the voice coil, and an outer ring and an elastic arm that are connected to the inner ring and the outer ring.

However, in the speaker in the related art, the inner ring and the outer ring of the flexible circuit board are connected only through a single elastic arm. After the flexible circuit board is used for a long time, the elastic arm may inevitably break due to long-term vibration during long-term use, resulting in silence of the speaker.

Therefore, it is desired to provide a speaker to overcome the above problems.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

The present disclosure will hereinafter be described in detail with reference to several exemplary embodiments. To make the technical problems to be solved, technical solutions and beneficial effects of the present disclosure more apparent, the present disclosure is described in further detail together with the figure and the embodiments. It should be understood the specific embodiments described hereby is only to explain the disclosure, not intended to limit the disclosure.

Figure 1:
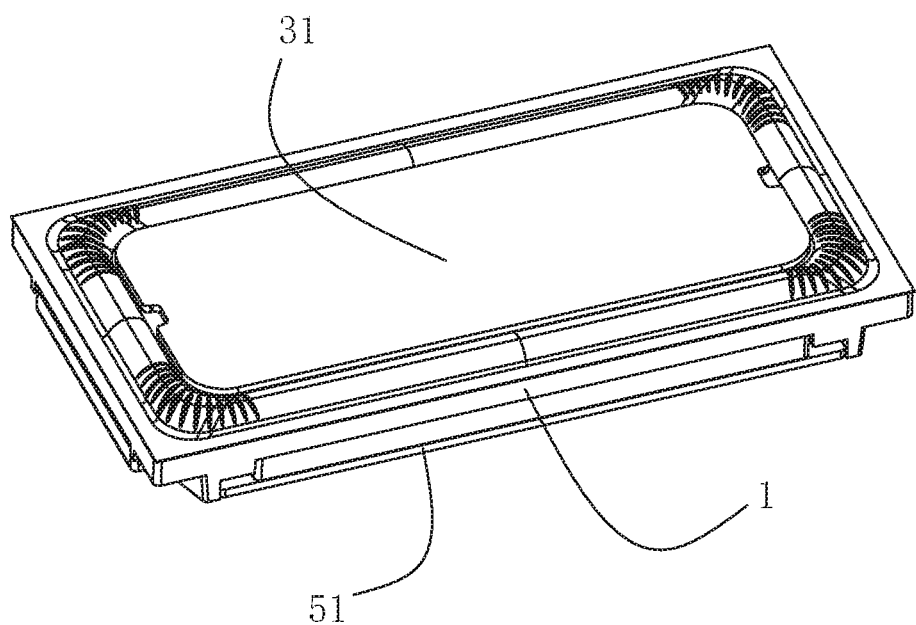
FIG. 1 is an isometric view of a speaker according to the present disclosure.
Figure 2:
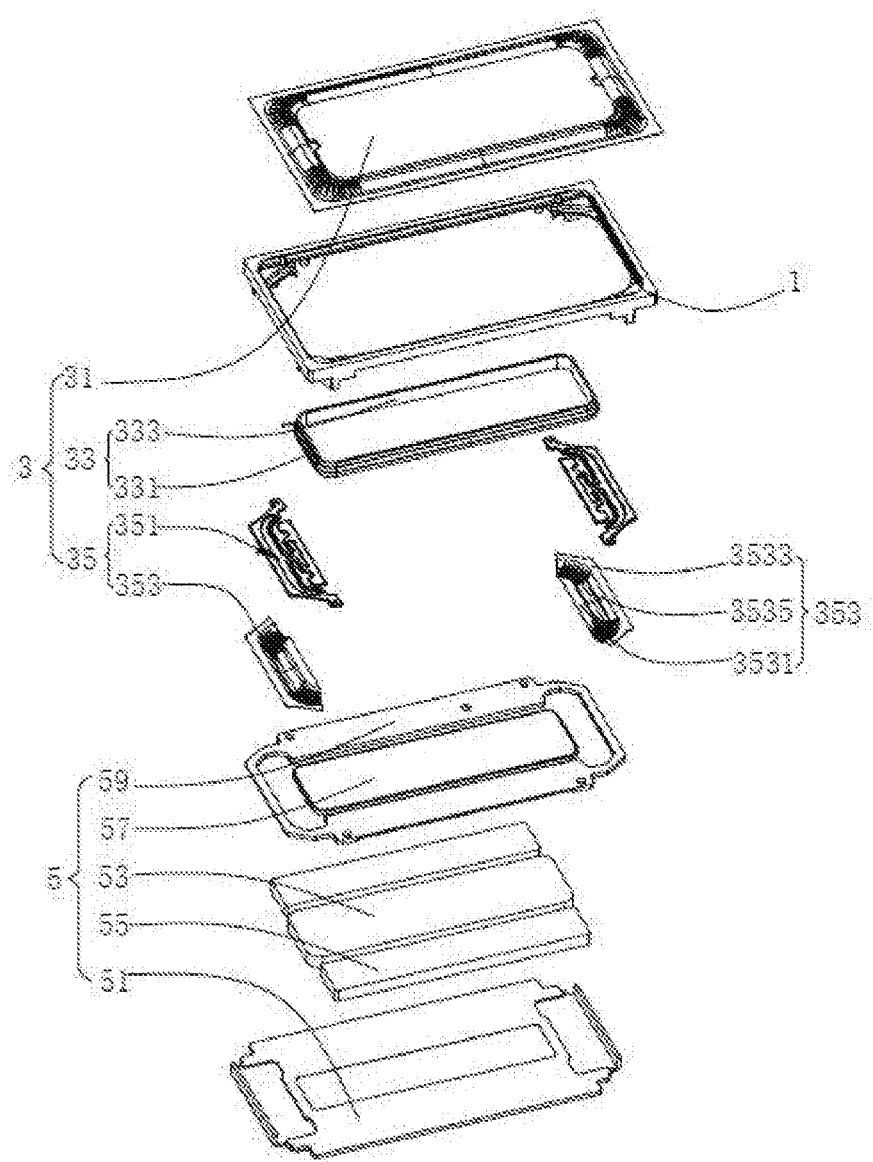
FIG. 2 is an exploded view of the speaker as illustrated in FIG. 1.

Referring to FIG. 1 and FIG. 2, FIG. 1 is an isometric view a speaker of the present disclosure, and FIG. 2 is an exploded view of the speaker as illustrated in FIG. 1.

The present disclosure provides a speaker 100. The speaker 100 includes a frame 1, a vibration system 3 and a magnetic circuit system 5. The vibration system 3 and the magnetic circuit system 5 are fixed to the frame 1. The vibration system 3 includes a first diaphragm 31 fixedly connected to the frame 1, a voice coil 33 disposed on one side of the first diaphragm 31 and configured to drive the first diaphragm 31 to vibrate to produce sound, and an elastic support part 35 disposed on a side of the voice coil 33 distal from the first diaphragm 31 and configured to elastically support the voice coil 33.

The first diaphragm 31 is disposed on a sound emitting side of the speaker 100. In particular, the first diaphragm 31 is capped on the frame 1.

The voice coil 33 is accommodated in the frame 1. The voice coil 33 includes two short side walls 331 and two long side walls 333 connecting the two short sidewalls 331 respectively. The two short sidewalls 331 and the two long side walls 333 are oppositely disposed. The two short side walls 331 and two long side walls 333 are end-to-end staggered to form a rectangular ring structure.

The elastic support part 35 includes a flexible printed circuit board 351 and a second diaphragm 353 disposed on a side of the flexible printed circuit board 351 distal from the first diaphragm 31. Specifically, the number of elastic support parts 35 is two. The two elastic support parts 35 and the two short sidewalls 331 are corresponding settings.

The flexible printed circuit board 351 is configured to connect the voice coil 33 to an external circuit. By disposing the flexible circuit board 351, positional deviation of the voice coil 33 due to vibration may be avoided.

Figure 3:
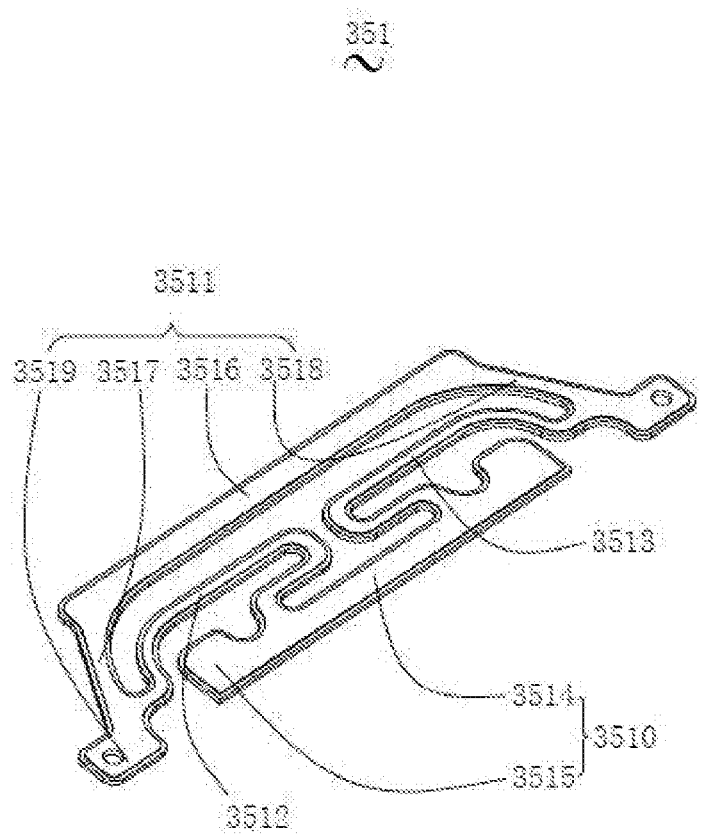
FIG. 3 is an isometric view of a flexible printed circuit board of the speaker as illustrated in FIG. 2.

Referring to FIG. 3 together, FIG. 3 is a schematic isometric view of a flexible printed circuit board of the speaker as illustrated in FIG. 2. The flexible printed circuit board 351 includes an inner ring 3510 connected to the voice coil 33, an outer ring 3511 connected to the frame 1, a first elastic arm 3512 and a second elastic arm 3513. Both ends of the first elastic arm 3512 and the second elastic arm 3513 are connected to the inner ring 3510 and the outer ring 3511 respectively, and the first elastic arm 3512 and the second elastic arm 3513 are oppositely disposed.

A first conductive region electrically connected to a lead of the voice coil is disposed in the inner ring 3510, and a second conductive region electrically connected to an external circuit is disposed in the outer ring 3511. A first conductive path is disposed in the first elastic arm 3512, and a second conductive path is disposed in the second elastic arm 3513. Both ends of the first conductive path and the second conductive path are respectively connected to the first conductive region and the second conductive region to form two conductive channels.

When the speaker 100 is in operation, by forming two conductive channels in the flexible printed circuit board 351, if one conductive channel breaks, the flexible printed circuit board 351 may still conduct the first conductive region and the second conductive region using the other another conductive channel, such that ensuring the sounding performance of the speaker 100 is ensured and the speaker 100 operates more reliably.

The inner ring 3510 includes a first fixing portion 3514 connected to the voice coil 33 and a first pad 3515 extending from the first fixing portion 3514 towards the outer ring 3511. The first conductive region is disposed on the first pad 3515.

The outer ring 3511 includes a second fixing portion 3516 disposed oppositely to the first fixing portion 3514, a first extension portion 3517 and a second extension portion 3518 that respectively extend from both ends of the second fixing portion 3516 towards a direction proximal to the inner ring 3510 and a second pad 3519 extending from the first extension portion 3517 or the second extending portion 3518 towards a direction proximal to the frame 1. The second conductive region is disposed on the second pad 3519.

Specifically, in this embodiment, both ends of the first elastic arm 3153 are respectively connected to the first fixing portion 3514 and the first extension portion 3517, and both ends of the second elastic arm 3513 are respectively connected with the first fixing portion 3514 and the second extending portion 3518.

The second pad 3519 is formed by extension from the first extension portion 3517 towards the direction proximal to the frame 1, and the first pad 3515, the second pad 3519 and the first elastic arm 3512 are positioned on the same side of the speaker 10.

More specifically, a third conductive path is disposed in the first fixing portion 3514, and a fourth conductive path is disposed in the second fixing portion 3516, the first extension portion 3517, and the second extension portion 3518.

The first conductive region, the first conductive path and the second conductive region are sequentially connected to form a conductive path. The first conductive region, the third conductive path, the second conductive path, the fourth conductive path and the second conductive region are sequentially connected to form another conductive path.

The second diaphragm 353 is configured to cooperate with the first diaphragm 31 enhance vibration of the first diaphragm 31. Specifically, the second diaphragm 353 includes a first support portion 3531 fixedly connected to the first fixing portion 3514, a second support portion 3533 fixedly coupled to the second fixing portion 3516, and a suspension 3535 connecting the first support portion 3531 with the second support portion 3533. The suspension 3535 is bent distally from the flexible printed circuit board 351.

Preferably, the first support portion 3531 and the first fixing portion 3514 and the second support portion 3533 and the second fixing portion 3516 are fixedly connected by adhesive.

The magnetic circuit system 5 includes a yoke 51, a primary magnet 53 assembled in a center of the yoke 51, and a secondary magnet 55 assembled on the yoke 51 and surroundingly disposed on the main magnet 153, a primary pole plate 57 attached to the primary magnet 53 and a sub pole core 59 attached to the sub magnet 55. The primary magnet 53 cooperates with the yoke 51 and the frame 1 to form a magnetic gap.

In this embodiment, the amount of the primary magnet is two, as illustrated in FIG. 2.

Compared with the related art, in the speaker 100 according to the present disclosure, the first elastic arm 3512 and the second elastic arm 3513 are disposed between the inner ring 3510 and the outer ring 3511, the first conductive region connected with the voice coil 33 in the inner ring 3510, the second conductive region connected to the external circuit is disposed in the outer ring 3511, the first conductive path is disposed in the first elastic arm 3511, the second path is disposed in the second elastic arm 3513, and both ends of the first conductive path and the second conductive path are electrically connected to the first conductive region and the second conductive region respectively, to form two conductive channels.

In the way, during vibration of the speaker 100, when one of the conductive channels breaks, the first conductive region and the second conductive region may still be conducted by the other conductive channel, such that the speaker 100 achieves stronger reliability.

It is to be understood, however, that even though numerous characteristics and advantages of the this embodiment have been set forth in the foregoing description, together with details of the structures and functions of the embodiments, the disclosure is illustrative only, and changes may be made in detail, especially in matters of shape, size, and arrangement of parts within the principles of the present disclosure to a full extent indicated by the general meaning of the terms in which the appended claims are expressed.

What is claimed is:

1. A speaker, comprising:
a frame;
a magnetic circuit system fixed to the frame;
a vibration system fixed to the frame, comprising:
a first diaphragm fixedly connected to the frame;
a voice coil disposed on a side of the first diaphragm and configured to drive the first diaphragm to vibrate to produce sound; and
an elastic support part disposed on a side of the voice coil distal from the first diaphragm and configured to elastically support the voice coil, the elastic support part comprising a flexible printed circuit board, the flexible printed circuit board connecting the voice coil to an external circuit, wherein the flexible printed circuit board comprises an inner ring connected to the voice coil, an outer ring connected to the frame, a first elastic arm and a second elastic arm, both ends of the first elastic arm and the second elastic arm being connected to the inner ring and the outer ring respectively, the first elastic arm and the second elastic arm being oppositely disposed, a first conductive region electrically connected to the voice coil being disposed in the inner ring, a second conductive region electrically connected to the external circuit being disposed in the outer ring, a first conductive path is disposed in the first elastic arm, a second conductive path being disposed in the second elastic arm, and both ends of the first conductive path and the second conductive path being electrically connected to the first conductive region respectively and the second conductive region to form two conductive channels, the inner ring includes a first fixing portion connected to the voice coil and a first pad extending from the first fixing portion towards the outer ring, and the first conductive region being disposed in the first pad, the outer ring comprises a second fixing portion disposed opposite to the first fixing portion, and a first extension portion and a second extension portion that respectively extend from both ends of the second fixing portion towards a direction proximal to the inner ring respectively, a second pad extending from the first extension portion or the second extension portion towards a direction of proximal to the frame, the second conductive region being disposed in the second pad, the elastic support part further includes a second diaphragm disposed on a side of the flexible printed circuit board distal from the first diaphragm, and the second diaphragm comprises a first support portion fixedly connected to the first fixing portion, a second support portion fixedly connected to the second fixing portion and a suspension portion connecting to the first support portion and the second support portion, the suspension portion bending in a direction distal from the flexible printed circuit board.

2. The speaker according to claim 1, wherein the two ends of the first elastic arm are respectively connected to the first fixing portion and the first extension portion, and the both ends of the second elastic arm are respectively connected to the first fixing portion and the second extension portion.

3. The speaker according to claim 1, Wherein the second pad is formed by extension from the first extension portion towards the direction of the frame, and the first pad, the second pad and the first elastic arm are positioned on the same side of the speaker.

4. The speaker according to claim 1, wherein a third conductive path is disposed in the first fixing portion, and a fourth conductive path is disposed in the second fixing portion, the first extension portion and the second extension portion, the first conductive region, and the first conductive path and the second conductive region are sequentially connected to form one of the conductive channels, the first conductive region, the third conductive path, the second conductive path, the fourth conductive path and the second conductive regions are sequentially connected to form another conductive channel.

5. The speaker according to claim 1, wherein the voice coil comprises two opposite short side walls and two long side walls connecting the two short side walls, the number of elastic support parts is two, and the two elastic support parts and the two short side walls are correspondingly disposed.

* * * * *